United States Patent [19]

Wegmann et al.

[11] Patent Number: 5,021,669

[45] Date of Patent: Jun. 4, 1991

[54] PROCESS AND SYSTEM FOR THE CONTROL OF THE FOCUSING OF A BEAM OF MONOPOLAR CHARGED PARTICLES

[75] Inventors: Urs Wegmann, Oberschan; Albert Koller, Trübbach, both of Switzerland

[73] Assignee: Balzers Aktiengesellschaft, Liechtenstein

[21] Appl. No.: 520,780

[22] Filed: May 8, 1990

[30] Foreign Application Priority Data

May 23, 1989 [DE] Fed. Rep. of Germany ....... 3916787

[51] Int. Cl.$^5$ .......................... B23K 15/00; H01J 3/28
[52] U.S. Cl. .......................... 250/396 ML; 250/396 R
[58] Field of Search ........... 250/396 ML, 396 R, 398, 250/310, 311, 492.1, 492.2, 492.3; 219/121.16; 328/228; 335/210

[56] References Cited

U.S. PATENT DOCUMENTS

| | | | |
|---|---|---|---|
| 3,420,977 | 1/1969 | Hanks et al. | 219/121.16 |
| 3,753,034 | 8/1973 | Spicer | 250/396 R |
| 4,064,352 | 12/1977 | Mann | 373/13 |
| 4,464,573 | 8/1984 | Dalglish | 250/396 R |
| 4,673,794 | 6/1987 | Irie et al. | 250/396 ML |

*Primary Examiner*—Jack I. Berman
*Assistant Examiner*—Kiet T. Nguyen
*Attorney, Agent, or Firm*—Louis Weinstein

[57] ABSTRACT

A process and a system are disclosed for controlling the focusing of a beam of monopolar charged particles which is used, for example, to vaporize substances in vacuum coating systems. The beam (S) has a cross-sectional area (Q) in a plane ($E_1$) transverse to the axis of the beam. Perpendicular to plane ($E_1$) there is a plane ($E_2$), the surface normal (R) to which indicates the direction in which the change in the cross-sectional area (Q) is to occur. According to the invention, flux density fields ($B_1$, $B_2$) are applied, which are parallel on opposite sides to plane ($E_2$) but have opposing directions. As a result, the change in the focusing of the beam has essentially no effect on any deflection of the beam; that is, it is possible to control the focusing without exerting any significant effect on the deflection.

33 Claims, 6 Drawing Sheets

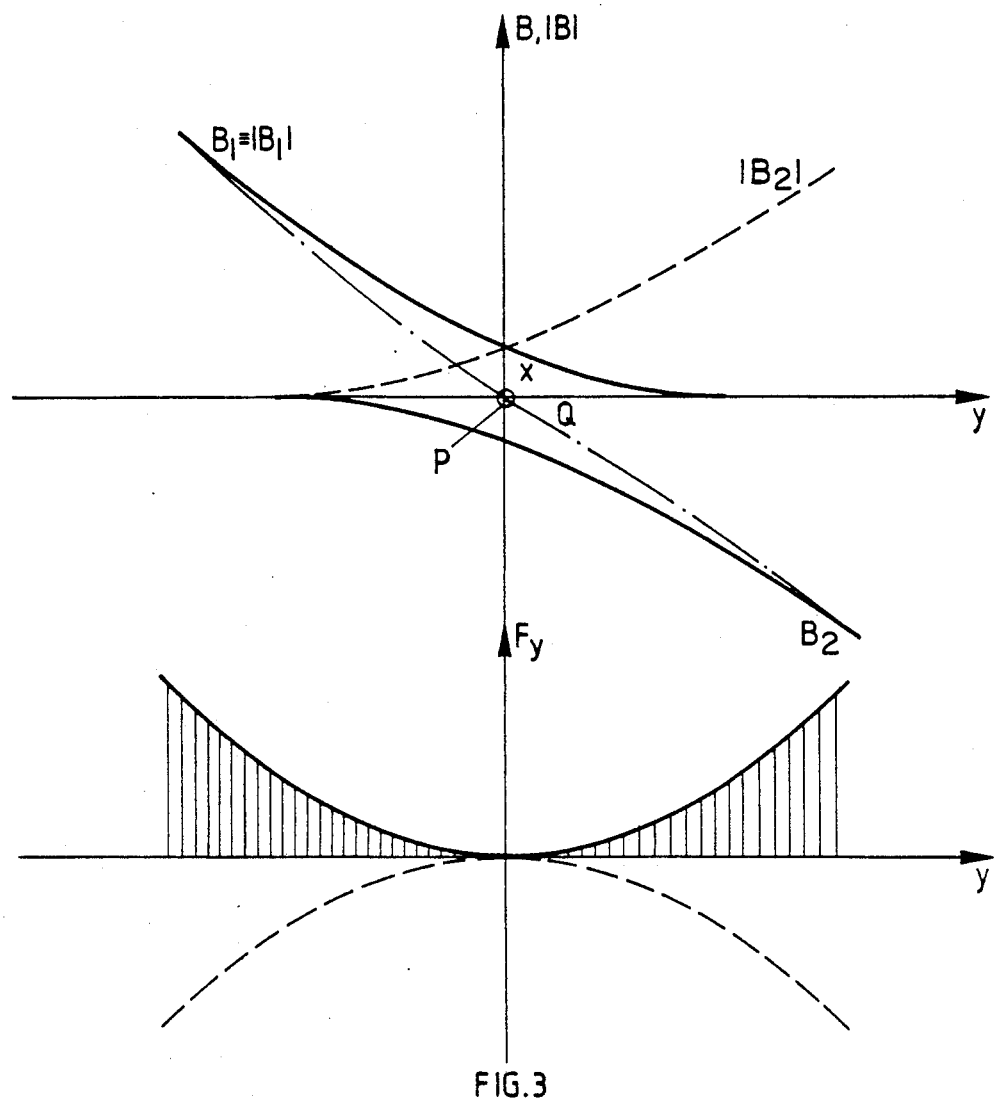
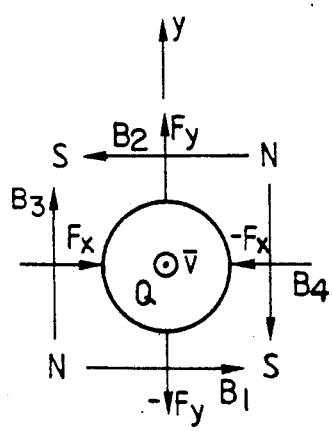
FIG.4
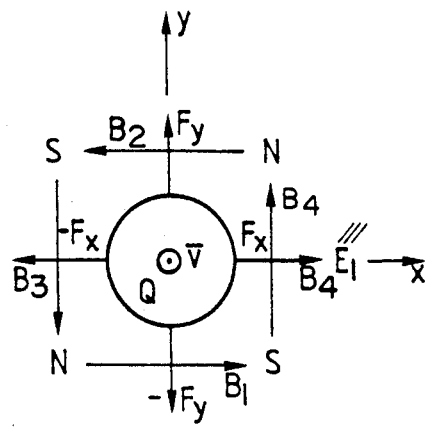
FIG.5

PROCESS AND SYSTEM FOR THE CONTROL OF THE FOCUSING OF A BEAM OF MONOPOLAR CHARGED PARTICLES

FIELD OF THE INVENTION

The present invention pertains to a process and to a system for controlling the focusing of a beam of monopolar charged particles, especially electrons, in accordance with the preambles of claim 1 and claim 15, respectively.

BACKGROUND OF THE INVENTION

It is known that the focusing of a beam of monopolar charged particles can be controlled by means of the action of a magnetic flux density field. Beams of this type, especially electron beams, are used, for example, to vaporize substances in vacuum coating systems. It is important in this case to be able to change, in a controlled manner, the cross-sectional area of the beam striking the material to be vaporized as well as its shape or extent and position; that is, it is important to be able not only to focus the beam in a controlled manner but also to deflect it in a controlled manner. The goal of controlled focusing, that is, of controlling the shape or size of the cross-sectional area striking the material to be vaporized, is, for example, to bring about the uniform removal of the material to be vaporized and/or to make allowances for the many different thermal characteristics of the various materials being vaporized.

When focusing is controlled by means of magnetic flux density fields, advantage is taken of the fact that moving charged particles such as electrons or ions are subjected in such a field to a force which is proportional to the charge of the particle being considered but also proportional to the cross-product of the particle velocity $\bar{v}$ times the magnetic flux density $\bar{B}$.

A process of this type is known from U.S. Pat. No. 4,064,352.

According to that document, pole shoes extend along both sides of the electron beam, between which a largely homogeneous magnetic field is generated by means of a magnet.

The field is nonhomogeneous in the narrow air gaps between the inward-projecting magnetic cores.

In addition, W. German Patent No. 2,719,725 discloses an electromagnetic beam focusing technique for an essentially flat beam in which, based largely on a quadrupole system, an encompassing rectangular frame core is provided in a plane perpendicular to the direction of beam propagation; winding arrays are provided on the shanks of this core. The fields controlling the focusing, which are antiparallel, extend for a certain distance in a way which corresponds to the extension of the flat beam. No provision is made for shifting the beam, as in the case of an adjustable beam deflecting system.

The present invention has the goal of creating a process and a system of the type indicated above by means of which the focusing can be adjusted in one direction within certain limits, independently of the position of the beam in the direction transverse thereto or in which the adjusted focusing remains unaffected when the beam is shifted in the transverse direction indicated.

In connection with the present invention, additional windings are of particular interest.

It can be seen in particular from this that the components of the field vectors directed toward the opposing magnetic cores exert a deflecting effect on the electron beam in the direction transverse thereto and that, even temporarily without consideration of the electromagnets, the transverse components of the magnetic field vectors in question, of the fields between the opposing pairs of cores, act in opposition to each other.

If now, by means of the system of electromagnets, the field in the air gap between one pair of cores is intensified and the one in the air gap between the other pair is weakened to the same extent, the deflecting field component in the direction from one core to the other remains constant precisely on one coordinate, such as on a plane of symmetry between the two air gaps of the pairs of cores, and then, in spite of the change in the field intensities, the electron beam remains unaffected by the deflecting field components in the direction from core to core, that is, by the pairs of cores, when, which is true only in the ideal case, the transverse extent of the electron beam is negligible. Otherwise, the deflecting forces acting on the electrons are different on the left from those on the right, and thus the point of greatest electron density shifts across the beam, which is equivalent to a change in beam deflection in the transverse direction and to a change in the way it is focused in this direction.

This effect is ignored in the document mentioned. It is assumed that, when the field change mentioned occurs, the change in the components in the direction of the pairs of cores does not affect the beam. Advantage is taken of the change in the field vector components in the transverse direction. If, as explained by way of example, the field is intensified in the air gap of one of the pairs of cores but weakened in the other air gap of the other pair, the transverse vector components in the first air gap will now be dominant.

This results in vector components in the transverse direction on both sides of the electron beam; these vector components are by definition parallel to each other and have opposing directions. This is how the focusing of the electron beam is influenced in the core pair direction.

By means of the system just described, it is impossible to adjust the focusing of the beam without simultaneously changing how it is deflected. Nor is it possible to change the position of the beam transversely to the focusing effect without readjusting the focusing control fields.

BRIEF DESCRIPTION OF THE INVENTION

The present invention also has the goal of creating a process for controlling the focusing which itself has essentially no effect on the deflection of the beam. With such a process, it is possible to modulate the focusing in an electron-optic system essentially independently of the deflection. The control is intended to act directly and thus highly efficiently on the focusing, which also means that the focusing can be adjusted quickly and over a wide range of settings.

This is achieved in accordance with the text of the characterizing portion of claim 1.

BRIEF DESCRIPTION OF THE FIGURES

Because the spatial relationships can be described much more clearly on the basis of figures, the way the invention works and preferred variants of the invention, in terms of both the process and system, are explained below by direct reference to the figures:

FIG. 3 shows a diagram of flux density field relationships modulated in a preferred manner according to the invention, under consideration of the field according to FIG. 2 in the x-direction;

FIG. 4 is a schematic diagram of a top view of the relationships according to FIG. 2 for the application of two flux density fields at right angles to each other in a first polarity relation according to the invention;

FIG. 5 shows a diagram similar to that of FIG. 4 with fields in a second polarity relation according to the invention;

DETAILED DESCRIPTION OF THE INVENTION AND THE PREFERRED EMBODIMENT THEREOF

Figure 1:
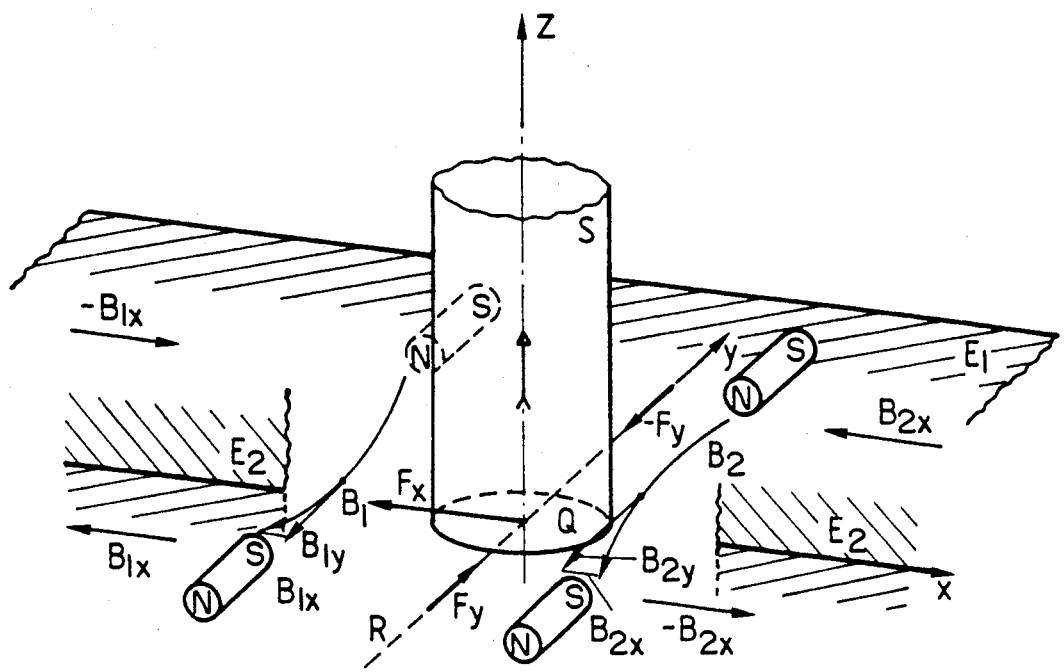
FIG. 1 shows the spatial arrangement of the beam and flux density fields according to the state of the art and the way in which they work.
Figure 2:
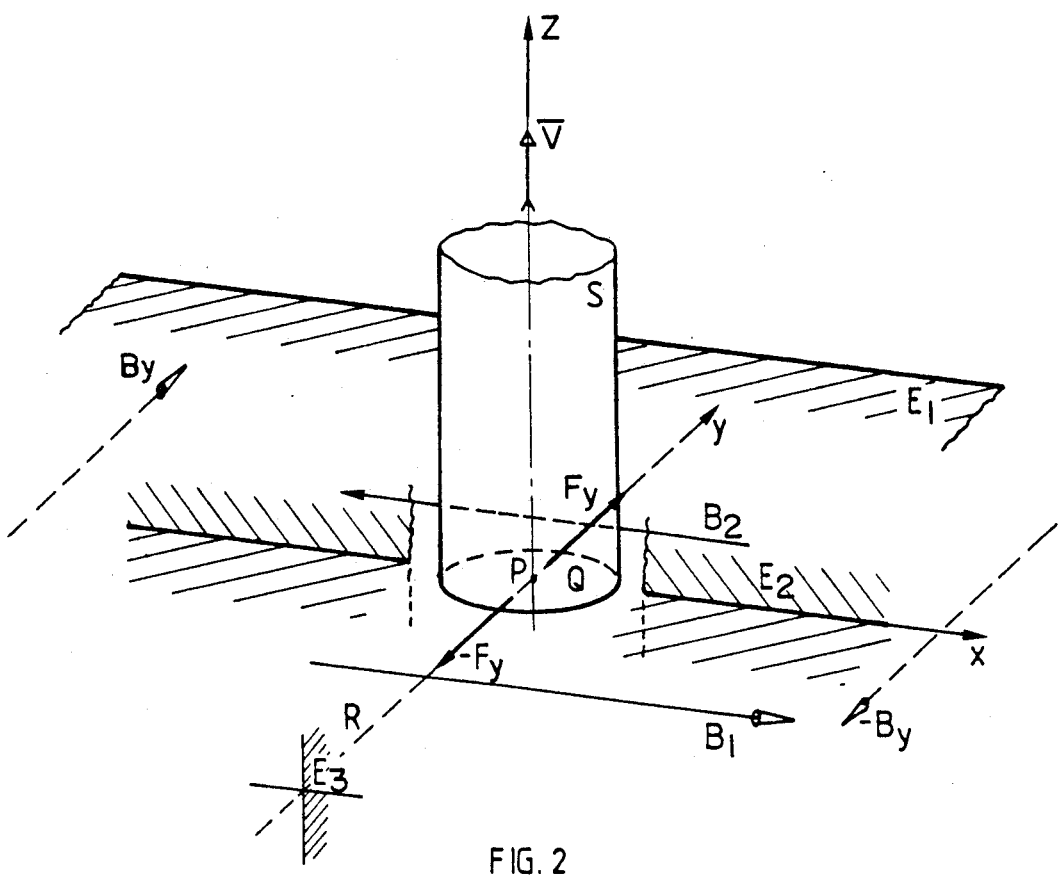
FIG. 2 shows a diagram similar to that of FIG. 1 but of a process according to the invention.

FIG. 2 shows the spatial arrangement of the beam of monopolar charged particles S and the plane $E_1$ transverse thereto, with the cross-sectional area Q through which the beam passes. The figure also shows the direction R, along which the extent of the beam cross-sectional surface Q is to be varied in a controlled manner, and the plane $E_2$, which is perpendicular to plane $E_1$ and to direction R, corresponding to the Y-axis in the xyz-coordinate system. According to the invention, a flux density field $\overline{B}$ is now applied on opposite sides of plane $E_2$, the courses of these fields being essentially parallel to each other; on the one side of plane $E_2$, the flux density field has one polarity, whereas on the other side the field has the other polarity. As a result of the two flux density fields $\overline{B}_1$ and $\overline{B}_2$ applied in accordance with the invention, a force $F_y$ is applied to the surface charge in the beam cross section Q on one side of plane $E_2$, whereas on the other side of this plane a force $-F_y$ is exerted, so that, depending on the polarities of the two flux density fields $\overline{B}_1$ and $\overline{B}_2$, the forces have a compressive or expansive effect on cross-sectional area Q indicated.

To the extent that fields $\overline{B}_1$ and $\overline{B}_2$ have essentially no curvature at least along the x-extent of area Q, the charge carriers at least in area Q experience essentially no forces in the x-direction; and when the field strength is modulated, that is, when the values of vectors $\overline{B}_1$ and $\overline{B}_2$ and their polarity are adjusted, the extent of the surface charge Q is controlled in the y-direction. Under the assumption that the extent in the x-direction is held constant in that, as already mentioned, at least in this region the field curvature is negligible, the net effect is that the charge density (surface charge) is reduced by the expansion of area Q in the y-direction.

But if, as entered in broken line, the flux density fields $\overline{B}_1$ and $\overline{B}_2$ applied in accordance with the invention are curved in the area of the extent of cross sectional area Q, the result is that components $B_y$ and $-B_y$ perpendicular to plane $E_2$ are produced, as entered in the figure, from which it can be seen that, in this case, too, simple relationships develop, in that, whenever cross-sectional area Q is expanded in the y-direction, it is simultaneously compressed in the x-direction and vice versa.

Nevertheless, so that changes in the extent of the surface in one direction (y) can be made independently of such changes in the other direction (x), in a preferred variant according to the text of claim 2 the condition of the parallelism of the two flux density fields $\overline{B}_1$ and $\overline{B}_2$ is satisfied at least over a region which corresponds to the extent of the cross-sectional area Q. In this way, a controlled change in flux density fields $\overline{B}_1$ and $\overline{B}_2$ does not lead to the formation of transverse components in the y-direction in these fields, as a result of which the charges in surface Q are also subjected to force only in the y-direction.

In the evaluation of whether, during the control of the focusing the beam undergoes a deflection or not, it must first be defined when a change in the focusing is to be described as a beam deflection. A charge within the beam cross-sectional area Q experiences no force—the path of such a charge or of the corresponding particle thus remaining unaffected—wherever the flux density fields $\overline{B}_1$ and $\overline{B}_2$ applied according to the invention cancel each other out. Conversely, it is possible to describe as deflection the simple situation in which the position of the center of the charge intensity of all charges occurring instantaneously in plane $E_1$ shifts. The position of the center of charge intensity of the charges in surface Q, considered at a single instant, does not change when the two flux density fields $\overline{B}_1$ and $\overline{B}_2$ on opposite sides of the second plane $E_2$ are applied symmetrically in accordance with the text of claim 3 and this symmetry is preserved during the controlled change of the fields.

This can be explained on the basis of FIG. 3. In FIG. 3, the effective values $\overline{B}_1$, $\overline{B}_2$ of the two flux density fields $\overline{B}_1$ and $\overline{B}_2$ are plotted against the y-axis, on which the extent of the cross-sectional area Q is plotted. The course of these values is shown in a purely qualitative fashion and corresponds approximately to a curve which decreases with increasing distance from a magnetic dipole being generated. If plane $E_2$ is laid through the center of charge intensity P of the surface charge on area Q, and if this center of charge intensity P is not to be changed when the surface extent in direction y is to be changed by the flux density fields applied in accordance with the invention, these two fields $\overline{B}_1$ and $\overline{B}_2$ are applied in such a way that they cancel each other out in plane $E_2$. The resulting course is shown qualitatively as a dot-dash line. If now, furthermore, the two flux density fields $\overline{B}_1$ and $\overline{B}_2$ are laid out in such a way that their values $|B_1|$, $|B_2|$ are symmetric to plane $E_2$, as shown in broken line, and if this condition is preserved even when there is a change in the fields, the net result is that the fields continue to cancel each other out one side, considered locally, at location P, and that forces of equal value act on the surface charge on opposite sides of plane $E_2$, as a result of which the charges in area Q travel along paths which have been modified symmetrically with respect to plane $E_2$. Thus the center of charge intensity remains at location P, and there is no deflection of the beam. The trough-like distribution of the resulting forces $F_y$ is shown qualitatively in FIG. 3 and in broken line for the opposite polarity.

It is known from, for example, U.S. Pat. No. 4,064,352, already mentioned, that electron beams, as beams of charged particles, can be directed in vacuum systems along a curved path from the beam generator onto the material to be vaporized. In some cases, this can be done by a good deal more than 180° and even by as much as 270° or more. To be able to realize this, it is necessary, in principle again by means of a magnetic flux density field, to apply force along extended sections of the beam path. This frequently means that flux density fields with the deflecting function indicated must be applied at a very early point, that is, very close to the beam generator, to achieve the large amount of deflection ultimately desired. For the sake of the type of deflection indicated and for the type of focusing control being discussed here, it is therefore impossible in many cases—including cases in which it is a goal to reduce the size of the electron optics to a desirable compactness—to shift the point at which the deflecting force is exerted to a location far enough away from where the focusing of the beam is controlled that, as a result of the deflection and its adjustment to change the position of the impact area of the beam on the material to be vaporized, the focusing of the beam is not also changed.

As can be seen from FIG. 3, when, as a result of these deflection measures the position of surface Q is changed, the corresponding surface charges enter into the changing relationships of the field applied according to the invention, as a result of which changes in the focusing occur in concert with the deflection. In view of these requirements, it is also frequently essential to be able to deflect the beam at least in one direction, without at the same time changing the focusing relationships. It is clear from FIG. 2 that this can be done easily by the use of a procedure according to the present invention:

Under the conditions shown in FIG. 2 for the two flux density fields $B_1$ and $B_2$ applied according to the invention, it is possible to shift the beam and thus its cross-sectional area Q in the x-direction without at the same time affecting the changes in the focusing which have been controlled in accordance with the invention in the y-direction. From this it can be seen that another preferred embodiment of the process according to the invention in accordance with the text of claim 4 consists in that the fields on either side of the second plane are applied in a constant manner over a region which is considerably longer than the extent of the cross-sectional area Q in such a way that the field relationships remain unchanged in the area in question and proceeding from that area in the x or −x direction. When, for example, the beam is now to be deflected over a large angle and this deflection is to be carried out in plane $E_2$, this can be accomplished even before the focusing is adjusted in accordance with the invention and can also be modified so as to change the position of the impact area without in this way having any effect on the focusing adjustment in accordance with the invention.

When we consider the course of the values $|B_1|$, $|B_2|$ of the applied flux density fields according to FIG. 3, it can be seen that in this way a three-dimensional surface is bracketed, with a valley extending in the x-direction, the sides of which rise up.

In many cases it can be desirable to be able to control the focusing of the beam in several directions, such as in two directions perpendicular to each other, either independently of each other or with one being controlled as a function of the other, that is, in principle and in accordance with FIG. 2, both in the y-direction and in the x-direction. For this purpose, it is proposed in accordance with claim 5 that, with respect to a third plane, namely $E_3$ in FIG. 2, which is perpendicular to the first plane $E_1$ and to the second plane $E_2$ and which is aligned in direction R, a second flux density field is applied with parallel vector components of opposite polarity on the two sides and preferably with values which are symmetrical to the third plane. A second flux density field of this type corresponds to the fields already entered in FIG. 2, indicated in broken line as $B_y$ and $-B_y$, which are produced when, as explained above, the first flux density field $\overline{B}_1$, $\overline{B}_2$, as also entered in solid line in FIG. 2, is curved.

The first magnetic flux density field with its components $\overline{B}_1$, $\overline{B}_2$ according to FIG. 2 are entered in FIG. 4 in the form of a top view onto a diagram analogous to FIG. 2. The second flux density field with its components $\overline{B}_3$, $\overline{B}_4$ is also shown. In the constellation according to FIG. 4, the polarities of the flux density fields $\overline{B}$ alternate as one travels around cross-sectional surface Q. In this way, the force relationships, also shown in FIG. 4, are produced; that is, when the polarity relationships are preserved, surface Q is compressed or stretched in the one direction x or y while it is stretched or compressed in the other direction y or x. This field polarity constellation can be realized easily by the provision of two magnetic dipoles, as can be seen from the distribution of the poles around surface Q.

A design of the flux density fields corresponding to claim 5 is shown in FIG. 5. The diagram is analogous to FIG. 4. In this case, as one travels around cross-sectional surface Q, the polarities of the flux density field components $B_1$ to $B_4$ do not alternate. In this constellation of the polarities, all forces brought about by the field components act, as shown, either outward or inward, as a result of which a centro-symmetric expansion or contraction of cross-sectional surface Q is made possible. This polarity constellation cannot, as is readily evident from the illustration of the magnetic poles, be realized by means of two magnetic dipoles. Additional measures must be taken for this purpose, such as those to be explained in connection with FIG. 7.

If as a result of the applied second flux density field with its components $B_3$ and $B_4$ in the two polarity distributions according to FIGS. 4 and 5, only the focusing of the beam corresponding to a change in its cross-sectional surface Q in the x or −x-direction is to be effected, this second flux density field is applied in a parallel manner at least over a distance corresponding to the extent of surface Q in the y-direction, according to the text of claim 6. With respect to the preferred symmetric pattern of the values of the second applied flux density field specified in claim 5, the considerations presented on the basis of FIG. 3 for the first applied flux density field apply: This is a requirement as long as the goal is to preserve the original location of the center of charge intensity of the surface charges situated at that moment in surface Q.

If according to claim 7 the second applied flux density field is also applied in such a way that the fields on either side of the third plane are constant over an area which is considerably longer than the extent of cross-sectional surface Q, then according to FIGS. 4 and 5 the change in the focusing in the x-direction by the second flux density field with its components $\bar{B}_3$, $\bar{B}_4$ is not affected by a deflection of the beam in the y direction, which brings about a local displacement of cross-sectional surface Q. The combination that, namely, the focusing in the y-direction caused by the first flux density field $\bar{B}_1$, $\bar{B}_2$ is not affected by a shift in surface Q or of the beam in the x-direction and that the focusing in the x-direction brought about by the second flux density field with its components $\bar{B}_3$, $\bar{B}_4$ is not affected by a shift in cross-sectional surface Q and thus of the beam in the y-direction is desirable in many cases, so that in particular the focusing control fields can be balanced more easily at a working point of the beam, around which it is deflected again in the x- and y-directions during operation.

Figure 6A:
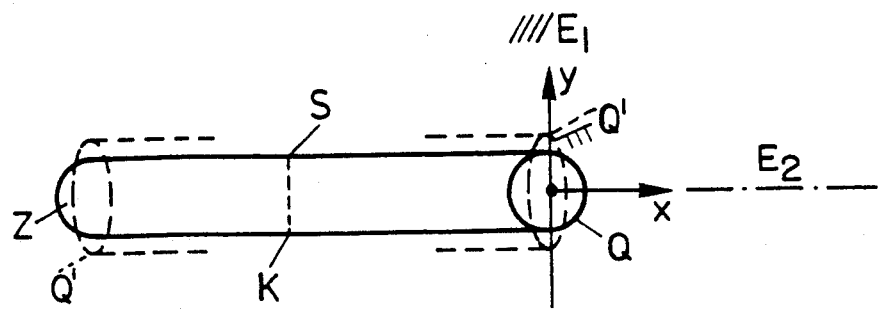
FIG. 6a shows a schematic diagram of a top view onto a highly deflected beam according to a top view onto the relationships according to FIG. 2 with, for example, a change in the focusing of the beam by means of fields according to FIG. 4.
Figure 6B:
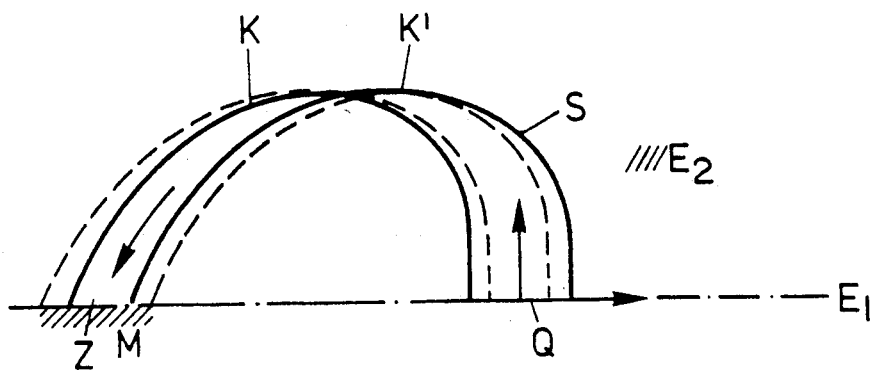
FIG. 6b is a view of the beam deflected at a wide angle according to FIG. 6a according to relationships which are changing in the y-direction according to FIG. 2 with the change in the focusing.

The polarity distribution according to FIG. 4 can offer considerable advantages in certain applications. In many applications of electron beams, as already mentioned, it is frequent practice to bring about a significant deflection of the beam in one plane. With the design of the first flux density field according to the invention with components $\bar{B}_1$, $\bar{B}_2$ according to FIG. 2, it is advisable, as shown in the top view of FIG. 6a, to achieve this deflection of beam S in the second plane $E_2$. FIG. 6b shows a side view of the course of beam S in plane $E_2$. With a deflection like this, an area K, in which the beam is constricted, is usually formed, as is also known from U.S. Pat. No. 4,064,352 and as shown in the side view of FIG. 6b. A constriction of this type does not occur in many cases when seen from the top, that is, in deflection plane $E_2$.

Optimum advantage can be taken of these relationships only when one proceeds in accordance with FIG. 4 and in correspondence with claim 8. When according to FIG. 4 the flux density field $\bar{B}_1$, $\bar{B}_2$ is used to expand cross-sectional surface Q and thus to expand the beam in the y-direction, the relationships shown in broken line in FIG. 6a are produced. At the same time, it is possible to use the second applied flux density field with the components $\bar{B}_3$, $\bar{B}_4$—coupled directly to the first flux density field—to compress cross-sectional surface Q. The cross-sectional surfaces Q' shown in broken line in FIG. 6a are the result.

Looking at FIG. 6b, however, we see that, when cross-sectional area Q is reduced in the x-direction, constricted region K is shifted, for example, to region K', that is, closer to the source of the beam. This is analogous to the shift of a focal point closer to a source of the beam. In this way, the inverse effect is produced on the target, e.g., the material M to be vaporized, as seen in the x-direction, i.e., in plane $E_2$; that is, when cross-sectional surface Q is compressed in this direction, the impact surface on material M is enlarged because of the shift of constricted region K'. Thus the advantage of the polarity selection shown in FIG. 4, in particular in the case of a large deflection of electron beam S in question by more than 90°, especially by more than 180°, becomes evident: Precisely through this choice of polarity, impact surface Z in FIG. 6 is expanded or compressed radially in all directions. The resulting qualitative distribution of the beam is also shown in FIG. 6b in broken line. The position of the constricted region, in the sense of a working point around which this position is changed by adjusting the focus, is determined essentially by the beam generator and by the electron-optic measures used to shape the beam.

Whereas—as will be explained further below—in the choice of a polarity configuration according to FIG. 5, this is realized preferably in that the first flux density field $\bar{B}_1$, $\bar{B}_2$ and the second flux density field $\bar{B}_3$, $\bar{B}_4$ are applied with an offset along the axis of the beam, in the embodiment according to FIG. 4 the two flux density fields are applied in essentially the same plane, i.e., in the first plane $E_1$, according to claim 9.

Figure 7:
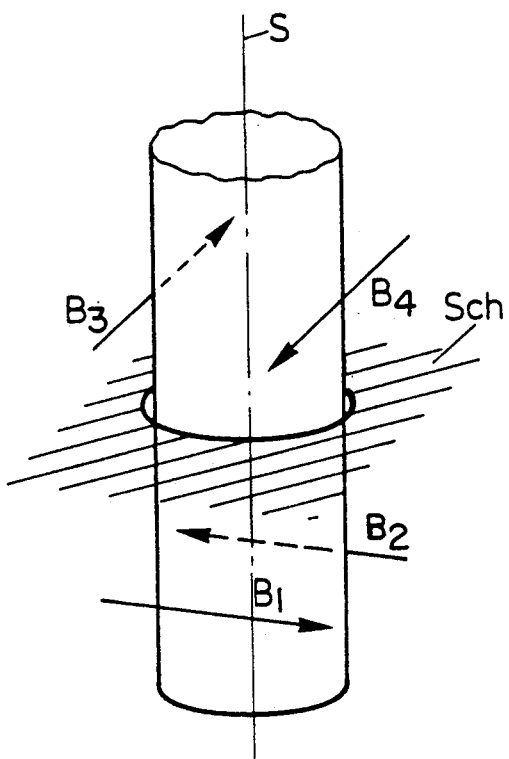
FIG. 7 is a schematic diagram of the arrangement of two orthogonal flux density fields, shifted in the direction of beam propagation.

If in the polarity configuration according to FIG. 4 or FIG. 5 the goal is to be able to modulate the first flux density field $\bar{B}_1$, $\bar{B}_2$ independently of the second $\bar{B}_3$, $\bar{B}_4$, then, according to FIG. 7 and the text of claim 10, the first flux density field $\bar{B}_1$, $\bar{B}_2$ is applied with an offset in the direction of propagation of beam S with respect to the second flux density field $\bar{B}_3$, $\bar{B}_4$. It is preferable to provide magnetic shielding Sch between the two flux density fields, so that the two fields cannot affect each other. This procedure is indicated in any case in the polarity selection according to FIG. 5. Nevertheless, this configuration can also be implemented by the time-staggered generation of field $\bar{B}_1$, $\bar{B}_2$ on the one hand and field $\bar{B}_3$, $\bar{B}_4$ on the other in plane $E_1$.

Figure 8:
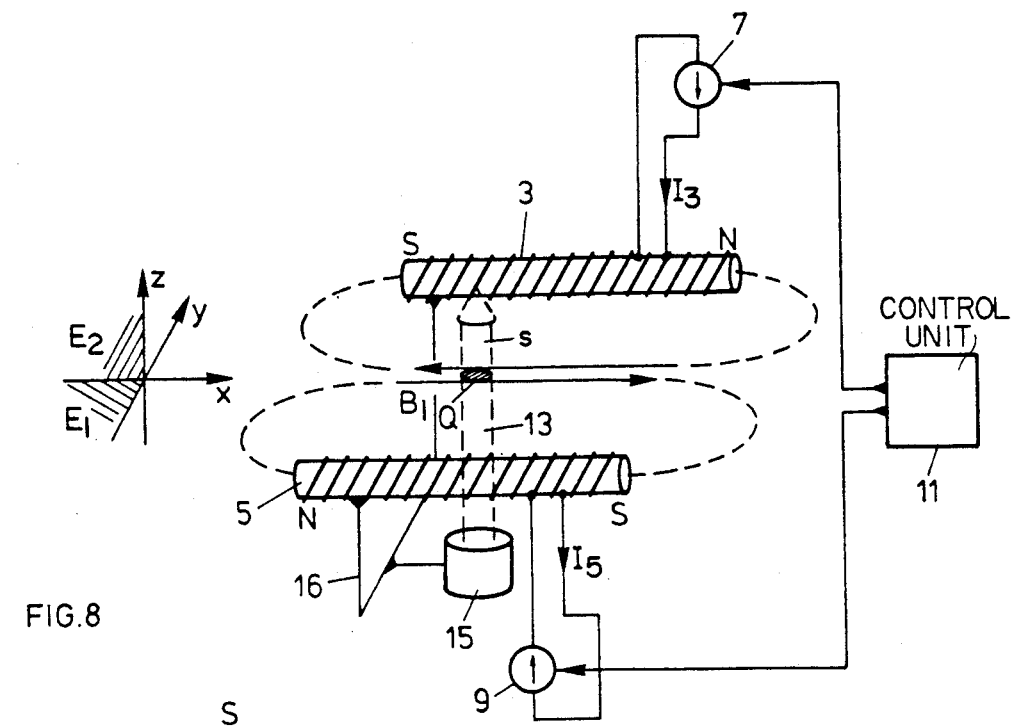
FIG. 8 is a schematic diagram of a system according to the invention for the realization of the relationships illustrated in FIGS. 2-6.

FIG. 8 is a schematic diagram showing by way of example a system according to the invention for controlling the focusing. It comprises an array of magnets, which is designed in principle so that the vector components of the flux density field generated by the magnet array, as explained on the basis of FIGS. 2 and 3, are produced. Preferably the array of magnets is formed by a pair of dipoles 3, 5, which are preferably formed by electromagnetic systems, each one supplied via power sources 7, 9, which are controlled by a control unit 11. Dipoles 3, 5 can also, however, for the sake of adjusting the focusing for different working points, for example, be formed by permanent magnets or include permanent magnets. In the system, a region 13 is defined, through which beam S of monopolar charged particles, electrons in particular, is sent. For this purpose, the position of a beam generator 15, illustrated schematically in FIG. 8, is fixed or fixable with respect to the dipole array consisting of dipoles 3, 5, such as by means of an adjustable mounting device for beam generator 15, so that the generator can be held in a defined position with respect to dipoles 3, 5. A corresponding fixed installation of dipoles 3, 5 and of beam generator 15 is shown schematically at 16. As can be seen from FIG. 8, the two dipoles 3, 5 generate in principle the components $\bar{B}_1$, $\bar{B}_2$ of the flux density field explained in FIG. 2, laid out with respect to region 13 for beam S as already explained on the basis of FIG. 2 with respect to beam S. According to the text of claim 14, the goal of a preferred embodiment of the invention is to shape the course of flux density field $\bar{B}_1$, $\bar{B}_2$ on opposite sides of plane $E_2$, also entered in FIG. 8, in such a way that the components are essentially parallel in a region which is at least the same as the diameter of beam cross-sectional surface Q, formed by the beam S passing through region 13. As can be easily seen from FIG. 8, in this simple way the goal is achieved that the length of dipole 3 or 5, considered in the x-direction, is much larger than the extent, considered in the x-direction, of cross-sectional surface Q of beam S passing through the intended region 13.

By means of control unit 11, flux density components $\bar{B}_1$, $\bar{B}_2$ on either side of region 13 where beam S passes through, that is, on either side of plane $E_2$, are controlled in such a way that the values of the flux density fields on either side of this plane $E_2$ are symmetric with respect to each other. In this way, according to the explanation of FIG. 3, it is achieved that, when beam cross-sectional area Q is changed in the y-direction by the controlling flux density fields $\bar{B}_1$, $\bar{B}_2$, the center of charge intensity of the surface charge present at that moment in area Q remains unchanged. The control of flux density fields $\bar{B}_1$, $\bar{B}_2$ such that this condition is fulfilled is carried out as a function of the geometric alignment of the two magnetic dipoles 3, 5 with respect to plane $E_1$, wherein cross-sectional area Q of beam S is to be effectively adjusted, by means of the appropriate choice or control of the currents generated by power sources 7, 9.

To achieve, furthermore, that the control in the y-direction of beam cross-sectional area Q of the beam passing through region 13 by means of magnet systems 3, 5 remains independent over a relatively long distance, considered in the x-direction, of the position of beam S in the x-direction, the magnetic field arrangement, preferably consisting of the two dipoles 3, 5, is designed in such a way that the course of flux density field $\bar{B}_1$, $\bar{B}_2$ is constant on either side of the indicated second plane $E_2$ over an area which is considerably longer than the extent of cross-sectional surface Q of beam S. This is in turn accomplished by the correspondingly long extent of magnetic dipoles 3, 5, seen in the x-direction.

Although it is quite possible to generate the course of the flux density field according to FIG. 2 by the 3-dimensional superimposition of several flux density fields, it is preferable, as shown in FIG. 8, to produce this field by means of an array of magnets with two magnetic dipoles, namely, dipoles 3, 5, which are essentially parallel to the second plane. These two dipoles do not initially need to be in plane $E_1$, nor do they need to be symmetric with respect to plane $E_2$. That is, the relative geometric position of dipoles 3, 5 with respect to their effective range, namely, the area of the intersection between planes $E_1$ and $E_2$, can be freely selected within wide limits while still ensuring that the flux density fields assume the desired configuration according to the invention in the effective area by means of the corresponding electrical modulation of the array of magnets.

Nevertheless, it may be necessary to take into account complicated spatial field superimpositions in some cases. If not necessary for other reasons, such as construction-related boundary conditions, one will therefore set up the two magnetic dipoles, as shown in FIG. 8, essentially in the first plane $E_1$, according to the text of claim 18. Then the field relationships are clear and logical. Even in this case, however, the two dipoles 3, 5 do not necessarily have to be symmetric to the second plane $E_2$, and it is obvious that an asymmetry can be compensated by the appropriate asymmetric modulation or asymmetric windings of power sources 7, 9 or of the electromagnets. Furthermore, unless there are no other boundary conditions such as design-related ones with respect to beam generator 15, one will preferably set up the magnetic dipoles lying in the first plane symmetrically with respect to the second plane as illustrated in FIG. 8 and as stated in claim 19.

Figure 9:
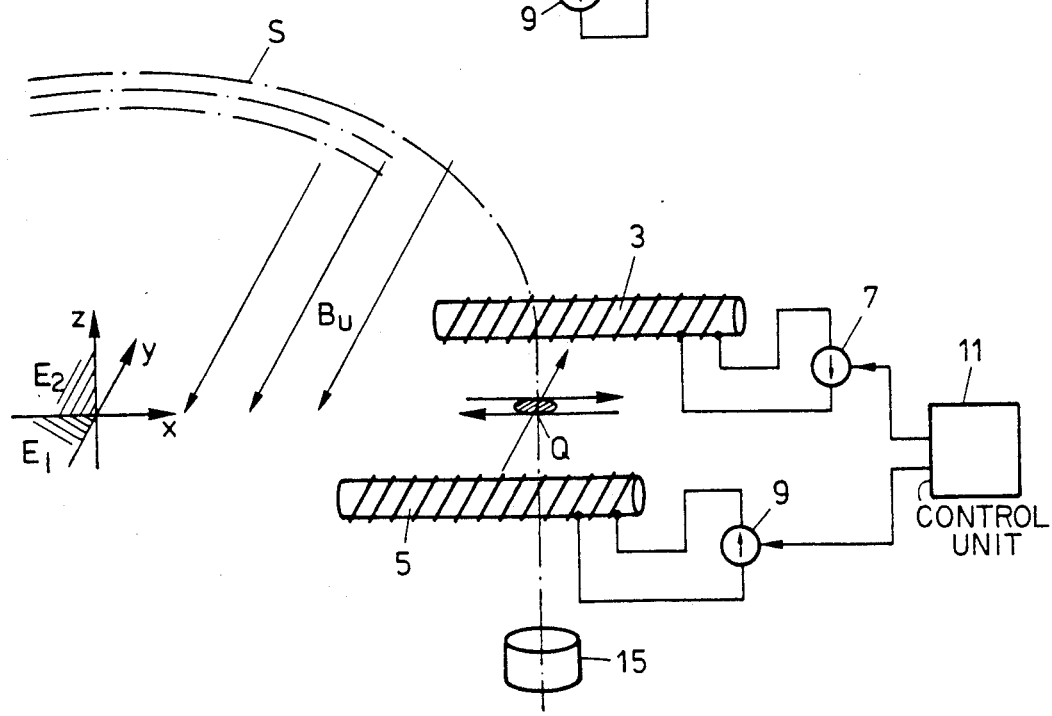
FIG. 9 is a system similar to that of FIG. 8, with the provision of a wide-ranging beam deflection field to produce deflecting relationships similar to those shown in FIGS. 6a and 6b.

FIG. 9 shows essentially a diagram of certain parts of the system according to FIG. 8 again. As explained previously, the control of the beam in the y-direction achieved in accordance with the invention by the two dipoles 3, 5 is, depending on the design of the dipoles and depending in particular on their length in the x-direction, almost completely independent of the position of the beam in the x-direction. If now, as is known, for example, from U.S. Pat. Nos. 4,064,352 and 3,420,977, the beam is subjected to a strong deflection, namely, to such an extent that deflecting forces must be exerted on the beam shortly after it leaves the beam generator, corresponding to 15 in FIG. 9, to bring the beam to its goal within a reasonably short distance, it is proposed that a deflection of this sort can be undertaken in accordance with the text of claim 20 essentially in the second plane.

This is illustrated in FIG. 9, wherein the deflecting device, such as that according to U.S. Pat. No. 3,420,977, generates a deflecting flux density field $B_U$, which extends essentially in the y-direction as shown in FIG. 9. In this way, as shown in broken line, beam S is deflected to an ever-increasing extent and can undergo a deflection up to 270° or even more. Because a deflection device of this type generating deflecting field $B_U$ must be effective very soon after the beam leaves generator 15 so that the beam can be deflected within the shortest possible distance, as required, it will be necessary to anticipate shifts of beam S in the x-direction even when the focusing control according to the invention is used, specifically when the deflection is modulated to shift the beam over the target.

Because the control of the focusing in the x-direction brought about according to the invention is essentially independent of the position of the beam in this direction, the deflection is therefore carried out preferably in plane $E_2$.

On the basis of FIGS. 4, 5, and 6 we have discussed the effects which occur when, in addition to the indicated first flux density field $\bar{B}_1$, $\bar{B}_2$, a second flux density field $\bar{B}_3$, $\bar{B}_4$ is applied perpendicular to the first.

Figure 10:
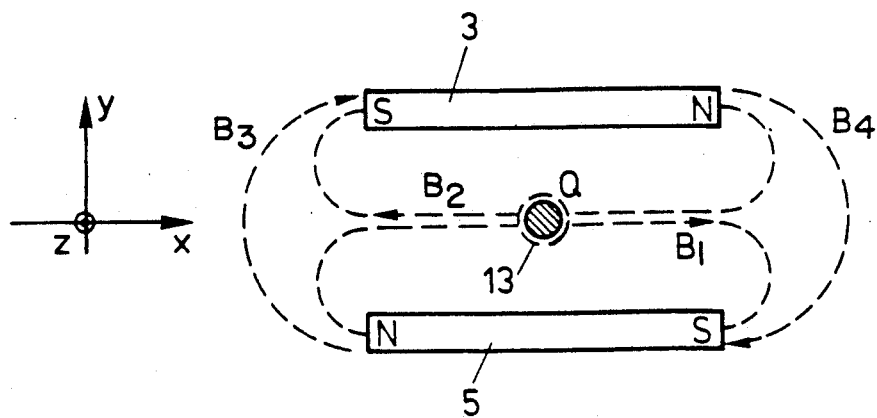
FIG. 10 is a schematic diagram of a top view onto a system according to FIG. 8 or FIG. 9 to generate field relationships similar to those shown in FIG. 4.

FIG. 10 is a schematic diagram of the system of two dipoles 3, 5, seen from the top, according to FIGS. 8 and 9. Depending on the distance between the two dipoles 3, 5 in the y-direction and their length in the x-direction, flux density fields $\bar{B}_3$, $\bar{B}_4$, which also act on the intended pass-through region 13 for beam S with its cross-sectional surface Q, are created, as shown schematically in FIG. 4. Thus, as a result of the appropriate dimensioning of the system with dipoles 3, 5, the flux density field configuration according to FIG. 4 with the field polarities shown there is achieved directly; therefore, the advantages pertaining to the inversion of target surface size changes with respect to cross-sectional surface size changes of Q are also obtained.

In principle, therefore, when the system includes a device for generating a beam such as an electron-optical system (depending on the type of particles constituting the beam) which generates at least one constricted area in the direction in which the beam propagates, as already explained on the basis of FIG. 6, the goal is to coordinate the array of magnets, as already explained on the basis of FIGS. 8, 9, and 10; the device such as the deflecting device shown in FIG. 9; and a beam generator of a known design in such a way that a change in the cross-sectional surface near the area of influence of the magnetic flux densities $\overline{B}_1$-$\overline{B}_4$ brought about by the array of magnets with dipoles 3, 5 has an inverse effect on a change in the diameter of a beam target surface, at least in one direction, as explained in detail on the basis of FIG. 6. This is achieved by means of the system according to FIG. 10 in the case of a deflecting device and a beam generator, which produce a constricted area according to FIG. 6b.

Figure 11:
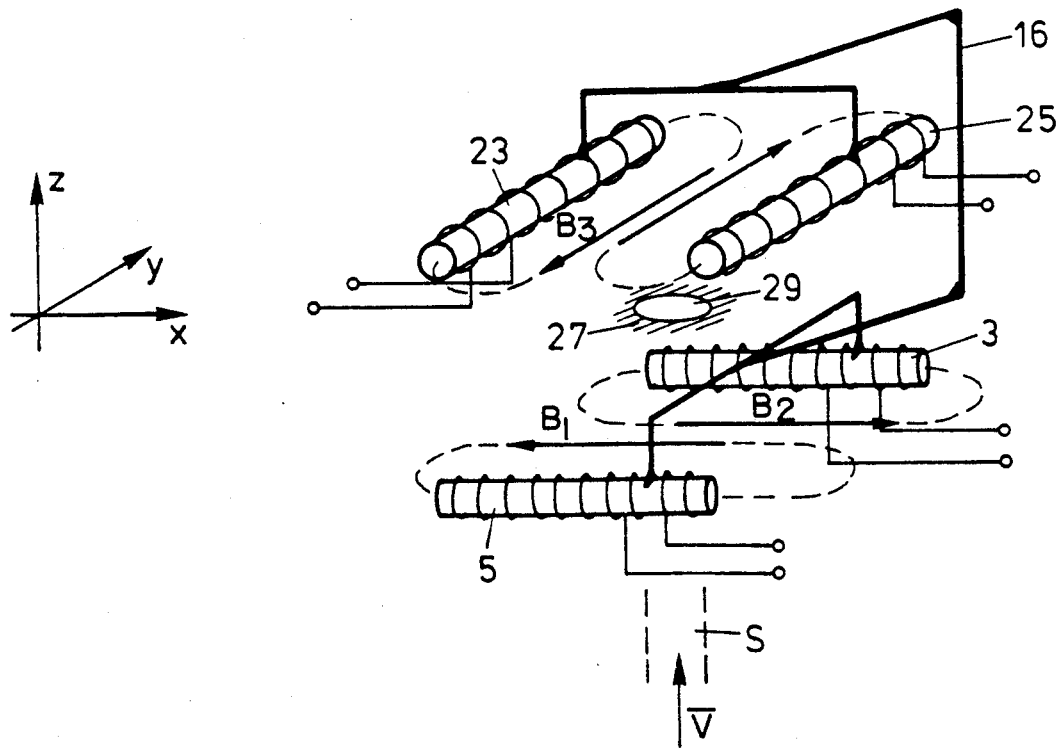
FIG. 11 is a schematic diagram of a system for generating orthogonal focusing control fields according to FIGS. 4 and 5 and with axial field displacement according to FIG. 7.

FIG. 11 shows in the form of a schematic diagram an array of magnets which makes it possible to modulate the flux density $\overline{B}_1$, $\overline{B}_2$ and the additional flux density $\overline{B}_3$, $\overline{B}_4$ perpendicular thereto independently of each other. For this purpose, the two dipoles 3, 5 are provided first in the direction of propagation of beam S; and then, with a certain offset in the direction of beam propagation, additional dipoles 23, 25 are provided, perpendicular to dipoles 3, 5. These additional dipoles modulate the flux density field $\overline{B}_3$, $\overline{B}_4$ according to FIG. 5 or FIG. 4. Through the provision of a magnetic shield 27 with a through-opening 29 for the beam, the two flux density fields $\overline{B}_1$, $\overline{B}_2$ and $\overline{B}_3$, $\overline{B}_4$ to be modulated independently of each other are almost completely decoupled from each other. In this way, it is possible to control the beam in terms of its focusing independently of each other both in the x-direction and in the y-direction. As shown schematically at 16, the two pairs of dipoles 3, 5 and 23, 25 are fixed in place with respect to the region intended for the beam.

Figure 12:
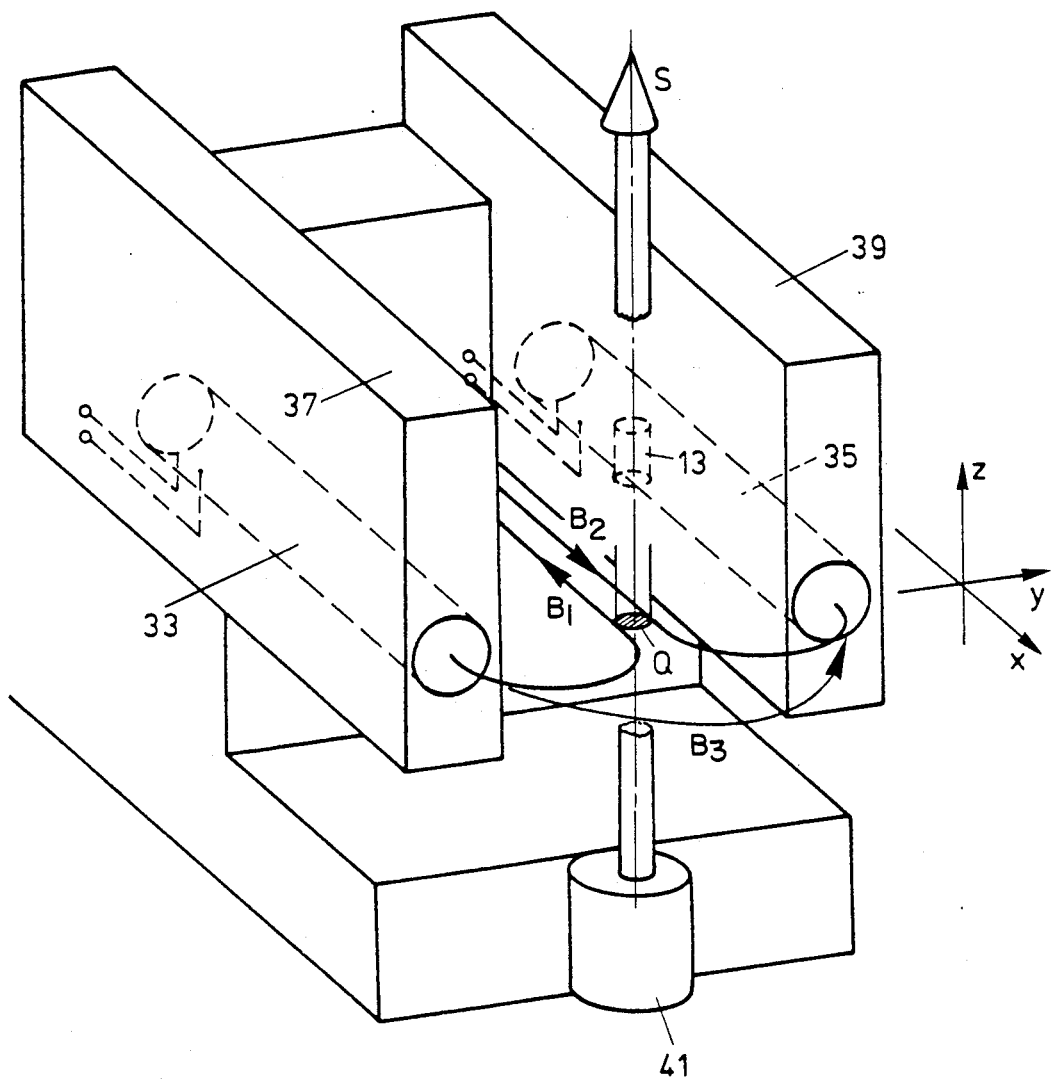
FIG. 12 shows a perspective view of the design of a preferred embodiment of a system according to the invention, constructed in principle in accordance with FIGS. 8 and 9.

FIG. 12 is a schematic diagram of a preferred design of a system according to the invention. Two electromagnets 33, 35, corresponding to dipoles 3, 5 of FIG. 8, 9, or 10, are parallel to each other, each embedded in its own cheek-like holder 37, 39. Holders 37, 39 are made of nonferromagnetic material, at least in the area of electromagnets 33, 35, but, so that they can also be cooled efficiently, they are preferably composed of portions of different metals, especially of portions of copper and stainless steel.

In a schematic manner, a holding system for a beam generator 41 is shown, which emits beam S, in particular an electron beam, centrally between holders 37, 39. The field configuration with flux density field $\overline{B}_1$, $\overline{B}_2$ is shown by way of example in FIG. 12, as is the effect of the transverse field $\overline{B}_3$.

By means of the system according to the invention and the process according to the invention, it was possible to adjust the cross-sectional extent of the beam on the target over a range of 1:10, e.g., from a focal point diameter of 5 mm to one of 50 mm, even when the beam was deflected by as much as about 270°. This could be accomplished dynamically at adjusting frequencies of up to 1 kHz. Thus it is also possible to pulse the focusing of the beam if desired. A latitude of modification, change and substitution is intended in the foregoing disclosure, and in some instances, some features of the invention will be employed without a corresponding use of other features. Accordingly, it is appropriate that the appended claims be construed broadly and in a manner consistent with the spirit and scope of the invention therein.

What is claimed is:

1. Process for controlling the focusing of a beam (S) of monopolar charged particles, especially electrons, which beam has a longitudinal axis Z and passes through a first plane ($E_1$) perpendicular to the axis (Z) of the beam with a beam cross-sectional area (Q), two magnetic flux density fields ($B_1$, $B_2$) being applied on opposite sides of a second plane ($E_2$) containing the axis of the beam (Z) in such a way that, in the area of the second plane, the main vector component of the field lines are essentially parallel to the second plane and the two fields have opposite polarities, the extent of the beam cross-sectional area (Q) being changed in the direction (y) perpendicular to the second plane ($E_2$) by the control of the two fields, characterized in that the two magnetic flux density fields ($B_1$, $B_2$) are generated with field lines essentially parallel to each other over a distance which is considerably greater than the extent of the beam cross-sectional area (Q) parallel to the second plane ($E_2$).

2. Process according to claim 1, characterized in that the two flux density fields ($B_1$, $B_2$) are applied with essentially symmetric values with respect to the second plane ($E_2$) and in that this symmetry is essentially preserved during controlled changes in the fields ($B_1$, $B_2$).

3. Process according to claim 1, characterized in that the fields ($B_1$, $B_2$) are applied in an essentially constant manner on opposite sides of the second plane ($E_2$) over an area which is much longer than the extent of the cross-sectional area (Q).

4. Process according to one of claim 1, characterized in that, with respect to a third plane ($E_3$) perpendicular to the first ($E_1$) and to the second ($E_2$), two additional flux density fields ($B_3$, $B_4$) are applied on opposite sides, with essentially parallel vector components of inverse polarity, preferably with essentially symmetric values with respect to the third plane ($E_3$).

5. Process according to claim 4, characterized in that the course of the field of the additional flux density fields are, in the area of the beam cross-sectional area (Q), laid out essentially parallel on opposite sides of the third plane over a length corresponding at least to the extent of the cross-sectional area.

6. Process according to claim 4, characterized in that the fields on opposite sides of the third plane are applied in an essentially constant manner over an area which is much longer than the extent of the cross-sectional area.

7. Process according to one of claim 4, characterized in that the additional fields ($B_3$, $B_4$) are applied in such a way that, the polarities of the field vectors ($B_1$, $B_2$, $B_3$, $B_4$) alternate as one passes around the cross-sectional area (Q) through the first plane ($E_1$).

8. Process according to one of claim 4, characterized in that the additional magnetic flux density fields ($B_3$, $B_4$) are applied essentially in the first plane ($E_1$) also.

9. Process according to one of claim 4, characterized in that the two flux density fields ($B_1$, $B_2$) and the two additional magnetic flux density fields ($B_3$, $B_4$) are applied with a certain offset in the beam propagation direction (Z) and are decoupled from each other, preferably being shielded from each other.

10. Process according to one of claim 1, where the beam (S) is also deflected, in such a way that, its cross-sectional area (Q) can be shifted in a controlled manner through the first plane ($E_1$), characterized in that the controlled deflection ($B_U$) is carried out in the second plane ($E_2$) in such a way that the beam cross-sectional area (Q) is shifted essentially parallel to the vectors of the two magnetic flux density fields ($B_1$, $B_2$).

11. Process according to claim 10, characterized in that the beam is deflected by more than 90°, in particular by more than 180°.

12. Process according to one of claim 4, characterized in that the action of the flux density fields ($B_1$, $B_2$, $B_3$, $B_4$) on a beam target area (M) is determined, so that it is inverted, with respect to the action on the cross-sectional area (Q) by means of the spatial determination of least one constricted area (K) of the beam.

13. Process according to claim 1, characterized in that the fields are changed, by being modulated, dynamically.

14. Process according to claim 13, characterized in that the fields are pulsed.

15. System for controlling the focusing of a beam of monopolar charged particles, especially electrons, with a region (13) for the passage of the beam, where a controlled array of magnets is provided by means of which the extent of the beam cross-sectional area (Q) is changed in a controlled manner in at least one direction (Y) through a plane ($E_1$) situated transversely to the beam cross section, in that, by means of the array of magnets, two magnetic flux density fields are applied in the first plane ($E_1$), these fields having vector components which, on opposite sides, in the area of a second plane ($E_2$) perpendicular to direction (Y) and to the first plane ($E_1$), and through the beam cross-sectional area (Q), are essentially parallel to each other and have opposite polarities, characterized in that the array of magnets (3, 5, 23, 25, 33, 35) is designed in such a way that the flux density fields ($B_1$, $B_2$), which are generated with field lines essentially parallel to each other in the area of the second plane ($E_2$), are parallel to the second plane over a distance which is considerably greater than the extent of the beam cross-sectional area (Q).

16. System according to claim 15, characterized in that the system of magnets is formed by two essentially parallel bar magnets.

17. System according to claim 15, characterized in that a control unit (11) for the array of magnets is provided, by means of which the magnets are controlled in such a way that the values of the flux density fields on either side of the second plane ($E_2$) are symmetric to that plane.

18. System according to claim 15, characterized in that the array of magnets (3, 5, 23, 25, 33, 35) is designed so that the course of the flux density fields ($B_1$, $B_2$) on either side of the second plane ($E_2$) is essentially constant over an area which is considerably longer than the extent of the cross-sectional area (Q).

19. System according to claim 15, characterized in that the array of magnets has two magnetic dipoles (3, 5, 23, 25, 33, 35), which are essentially parallel to the second plane ($E_2$).

20. System according to claim 19, characterized in that the two magnetic dipoles (3, 5, 23, 25, 33, 35) are situated essentially in the first plane ($E_1$).

21. System according to claim 20, characterized in that the magnetic dipoles (3, 5, 33, 35) situated in the first plane ($E_1$) are essentially symmetric to the second plane ($E_2$).

22. System according to claim 15, with a controlled deflection device ($B_U$) for the beam (S), characterized in that the deflection device deflects the beam essentially in the second plane ($E_2$).

23. System according to one of claim 15, characterized in that the system of magnets generates additional flux density fields ($B_3$, $B_4$) perpendicular to the second plane ($E_2$), with opposite polarities on either side of region (13) for the beam (S).

24. System according to claim 22, with a device for generating a beam in the manner of an electron-optic system, which generates at least one constricted area (K) of the beam (S) in the direction of beam propagation, characterized in that the array of magnets (3, 5, 23, 25, 33, 35) and the device ($B_U$) are coordinated in such a way that a change in the cross-sectional area in the region of the influence of the flux density fields ($B_1$, $B_2$, $B_3$, $B_4$) produced by the array of magnets has the inverse effect, at least in one direction (X), on the diameter of the beam target surface.

25. System according to claim 15, characterized in that the array of magnets has two magnetic dipoles (3, 5, 33, 35), each of which is installed in one of two holders (37, 39) a certain distance away from each other, and in that the region for the beam passes between the holders (37, 39).

26. System according to claims 15, characterized in that a positioning and fixing system is provided for the beam generator (15, 41) so that the generated beam (S) passes through the predetermined region (13).

27. System according to claim 25, characterized in that the holders (37, 39) consist, in the area of the dipoles (33, 35), of a largely nonferromagnetic material and in that the dipoles are preferably encapsulated in the holders (37, 39) in a vacuum-tight manner.

28. System according to claim 25, characterized in that the holders have portions of different metals, such as copper and stainless steel.

29. System according to claims 15, characterized in that the array of magnets comprises permanent magnets and/or electromagnets.

30. A system for controlling the focusing of a beam of monopolar charged particles, especially electrons, with a region (13) for the passage of the beam, said beam being produced by electron beam generating means, where magnetic field generating means is provided by means of which the extent of the beam cross-sectional area (Q) is changed ion a controlled manner in at least one direction (Y) through a plane ($E_1$) situated transversely to the beam cross-section, in that, by means of the said magnetic field generating means, two magnetic flux density fields are applied in the first plane ($E_1$), these fields having vector components which, on opposite sides, in the area of a second plane ($E_2$) perpendicular to direction (Y) and to the first plane ($E_1$), and through the beam cross-sectional area (Q), are essentially parallel to each other and have opposite polarities, characterized in that the magnetic field generating means (3, 5, 23, 25, 33, 35) includes means for generating flux density fields ($B_1$, $B_2$), having field lines essentially parallel to each other in the area of the second plane ($E_2$), are parallel to the second plane over a distance which is considerably greater than the extend of the beam cross-sectional area (Q).

31. A vacuum treatment system comprising:
electron beam generating means;
means for controlling the focusing of the beam with a region (13) for the passage of the beam, said beam being produced by electron beam generating means, where magnetic field generating means is provided by means of which the extend of the beam cross-sectional area (Q) is changed in a controlled manner in at least one direction (Y) through a plane ($E_1$) situated transversely to the beam cross-section, in that, by means of the magnetic field generating means, two magnetic flux density fields are applied in the first plane ($E_1$), these fields having vector components which, on opposite sides, in the area of a second plane ($E_2$) perpendicular to direction (Y) and to the first plane ($E_1$), and through the beam cross-sectional area (Q), are essentially parallel to each other and have opposite polarities, characterized in that the magnetic field generating means (3, 5, 23, 25, 33, 35) includes means for generating flux density fields ($B_1$, $B_2$), having field lines essentially parallel to each other in the area of the second plane ($E_2$), are parallel to the second plane over a distance which is considerably greater than the extend of the beam cross-sectional area (Q).

32. A system including electron beam generating means;
means for controlling the focusing of the beam, with a region (13) for the passage of the beam, said beam being produced by electron beam generating means, where magnetic field generating means is provided by means of which the extend of the beam cross-sectional area (Q) is changed in a controlled manner in at least one direction (Y) through a plane ($E_1$) situated transversely to the beam cross-section, in that, said magnetic field generating means includes means for generating two magnetic flux density fields which are applied in the first plane ($E_1$), these fields having vector components which, on opposite sides, in the area of a second plane ($E_2$) perpendicular to direction (Y) and to the first plane ($E_1$), and through the beam cross-sectional area (Q), are essentially parallel to each other and have opposite polarities, characterized in that the magnetic field generating means (3, 5, 23, 25, 33, 35) includes means for generating flux density fields ($B_1$, $B_2$), having field lines essentially parallel to each other in the area of the second plane ($E_2$), are parallel to the second plane over a distance which is considerably greater than the extend of the beam cross-sectional area (Q); and
means for deflecting the electron beam by at least 90° and, in particular, by more than 180°.

33. A control system comprising:
electron beam generating means;
means for controlling focusing of the beam including magnetic field generating means for changing the cross-sectional area of the beam in at least one direction through an imaginary plane transverse to the beam cross-section;
said magnetic field generating means generating first and second magnetic fields on opposite sides of said beam, said fields being essentially parallel to one another and of opposite magnetic polarity;
said magnetic fields having field lines which are essentially parallel to one another and to a plane perpendicular to said first mentioned plane, said parallel of said magnetic fields extending over a distance which is considerably greater than the extent of the cross-sectional area of the base.

* * * * *

UNITED STATES PATENT AND TRADEMARK OFFICE
CERTIFICATE OF CORRECTION

PATENT NO. : 5,021,669

DATED : June 4, 1991

INVENTOR(S) : Wegmann et al.

It is certified that error appears in the above-identified patent and that said Letters Patent is hereby corrected as shown below:

```
Column 12, line 27, delete "one of"
Column 12, line 44, delete "one of"
Column 12, line 49, delete "one of"
Column 12, line 52, delete "one of"
Column 12, line 58, delete "one of"
Column 13, line 1,  delete "one of"
Column 13, line 64, delete "one of"
Column 14, line 30, change "claims" to --claim--
Column 14, line 39, change "ion" to --in--
Column 14, line 54, change "extend" to --extent--
Column 14, line 62, change "extend" to --extent--
Column 15, line 12, change "extend" to --extent--
Column 15, line 20, change "extend" to --extent--
Column 16, line 9,  change "extend" to --extent--
```

Signed and Sealed this

Sixteenth Day of February, 1993

*Attest:*

STEPHEN G. KUNIN

*Attesting Officer*  *Acting Commissioner of Patents and Trademarks*